March 10, 1970 KAZUO WATANABE ET AL 3,499,988

LOUD SPEAKER APPARATUS WITH AUDIO FREQUENCY AMPLIFIER MOUNTED THEREON

Filed Sept. 30, 1966

INVENTORS
KAZUO WATANABE
KATSUO TANMATSU

BY Darby & Darby

ATTORNEYS

United States Patent Office 3,499,988

Patented Mar. 10, 1970

3,499,988
LOUDSPEAKER APPARATUS WITH AUDIO FREQUENCY AMPLIFIER MOUNTED THEREON

Kazuo Watanabe, Osaka, and Katsuo Tanmatsu, Daitoh-shi, Japan, assignors to Sanyo Electric Co., Ltd., Moriguchi-shi, Japan, a corporation of Japan Filed Sept. 30, 1966, Ser. No. 583,377
Claims priority, application Japan, Oct. 8, 1965, 40/82,226; Oct. 20, 1965, 40/86,127; Nov. 9, 1965, 40/91,201
Int. Cl. H01l *1/02;* H04r *9/06*
U.S. Cl. 179—1 1 Claim

ABSTRACT OF THE DISCLOSURE

An audio frequency system having a loudspeaker in which the audio amplifier is mounted directly to the speaker to form a unitary structure with a heat generating component of the amplifier mounted to use the speaker as a heat sink.

This invention relates to loud speaker apparatus and more particularly to novel arrangements for mounting the audio frequency amplifier of an electronic sound reproducing system directly to a loud speaker.

In electronic sound reproducing systems, such as those used in conventional transistorized television receivers, the loud speaker and the audio frequency amplifier for driving it are usually mounted separately. Normally, the speaker is mounted on one side of the receiver cabinet and the audio frequency amplifier is located on the chassis of the receiver. While this arrangement is perfectly operable, the space at the back of the speaker, including its yoke and frame, is not effectively used. Also, it is troublesome to repair receivers of this type due to the separation of the amplifier and the loud speaker which are connected by several lead wires.

The present invention provides several novel arrangements in which the space at the back of the loud speaker is effectively used by mounting on the speaker an audio frequency amplifier, for example of the transistor type. This provides a unitized combination loud speaker-audio frequency amplifier apparatus which operates in response to receiving an audio frequency input signal at a relatively low amplitude, and power supply voltage. Also in accordance with the invention the metallic frame or yoke of the loud speaker is utilized as a heat sink for at least one power transistor of the audio frequency amplifier.

An additional feature of the invention is to provide a combined audio frequency amplifier and loud speaker apparatus with the former being mounted on the loud speaker and being easily detachable therefrom so that it is convenient for a service man to repair the sound reproducing portion of the receiver. Another feature is that the unitized loud speaker and audio frequency amplifier can be readily used in a variety of radio and television receivers and other sound reproducing devices.

It is therefore an object of the present invention to provide a combined loud speaker and audio frequency amplifier apparatus, in which the audio frequency amplifier is mounted on a portion of the loud speaker.

A further object is to provide a combined loud speaker-audio frequency amplifier apparatus in which a metallic portion of the loud speaker frame or yoke serves as a heat sink for a transistor of the audio frequency amplifier.

Still another object is to provide a unitary loud speaker and audio frequency apparatus in which the audio frequency amplifier is readily detachable from the loud speaker.

Other objects and advantages of the present invention will become more apparent upon reference to the following specification and annexed drawings in which.

Figure 1:
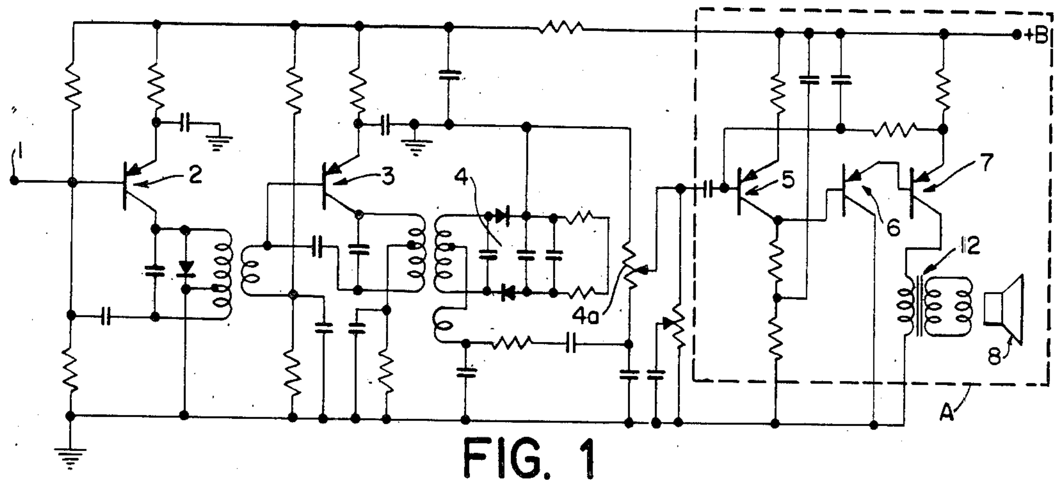
FIG. 1 is a schematic diagram of a commonly used transistorized audio frequency amplifier circuit.

Referring to FIG. 1 a commonly used circuit for the sound reproducing portion of a transistorized television receiver is shown. This includes intermediate frequency amplifier stages 2 and 3, a detector 4 and an audio frequency amplifier circuit including direct coupled amplifier stages 5, 6 and 7. The circuit has an input terminal 1 which receives the intermediate frequency sound signal, for example, of 4.5 mHz. This signal is amplified by the two intermediate frequency amplifier stages 2 and 3 detected in a conventional detector circuit 4, and applied via the tap of a volume control 4*a* to the audio frequency amplifier circuit designated by the dotted block A. The audio frequency amplifier stage comprises three cascaded transistors 5, 6 and 7 connected in a conventional feedback type circuit. At least transistor 7 has a relatively high current carrying capacity for driving a loud speaker 8 through an output transformer 12.

While FIG. 1 is described with respect to a television receiver, it should be understood that the audio frequency amplifier circuit A can be used with any type of sound reproducing equipment, such as conventional amplitude and/or frequency modulation receivers, stereo FM receivers (two circuits A needed) and phonographs. Also, any type of audio frequency amplifier circuit can be utilized. In the preferred embodiment of this invention, the audio frequency amplifier circuit of block A is of the transistorized type and is mounted on a conventional printed circuit board. The printed circuit board is in turn mounted on a portion of the speaker 8 with a part of the metal frame or yoke of the speaker 8 serving as a heat sink for one or more of the transistor amplifiers which emit heat when the circuit is in operation.

Figure 2:
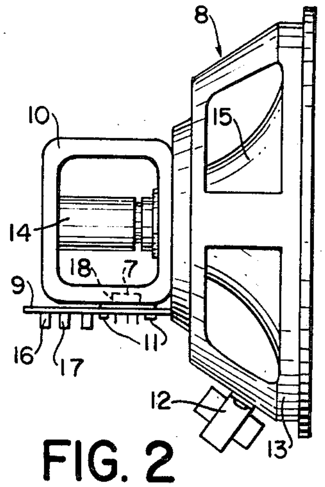
FIG. 2 is a side view of a combined loud speaker audio frequency amplifier apparatus according to one embodiment of the present invention.

A preferred embodiment of the invention is shown in FIG. 2. Here a printed circuit board 9 having all of the electrical components of the audio frequency amplifier A mounted thereon is mounted on one wall of the rectangular metal yoke 10 of the loud speaker 8 by any suitable fastener such as the screws 11. Several of the electrical components of the amplifier, such as the resistors and capacitors, etc. of the amplifier A are designated by numerals 16 and 17.

The output transformer 12 is mounted on one of the legs of the metal frame 13 of the loud speaker by any suitable fastening device, such as one or more rivets. Speaker 8 has a permanent magnet 14 mounted within the yoke 10 and a movable diaphragm 15 within the frame.

In the embodiment of FIG. 2 a recess 18 is formed in the wall of the yoke 10 on which the board 9 is mounted as indicated by the dotted lines. A power transistor of the audio amplifier A, for example transistor 7, is mounted on the printed circuit board 9 so that its housing fits into the recess 18 and engages the surrounding portion of the yoke over as large a surface area as possible. By doing this the yoke 10 serves as a heat sink for the power transistor and provides a considerable amount of heat dissipative area, that is, the entire speaker yoke and frame.

Figure 3:
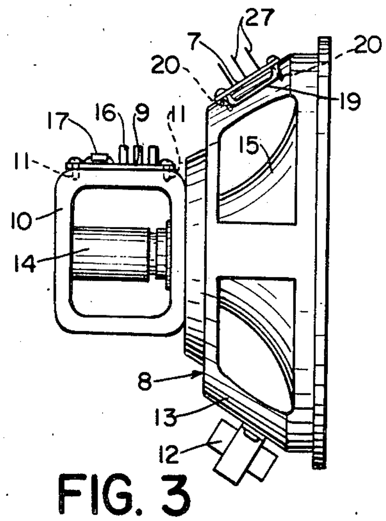
FIG. 3 is a side view of another embodiment of the invention.

FIG. 3 shows another embodiment of the invention in which similar reference numerals are used for the same parts shown in FIGS. 1 and 2. Here, a recess 19 is formed in one of the legs of the frame of the loud speaker. The printed circuit board 9 is mounted on the yoke 10 as in FIG. 2, and the power transistor 7 is mounted in the recess 19 by fasteners such as the screws 20, so that its housing engages the frame. Here again the outer metal portions of the speaker serve as a heat sink. Wires (not shown) are provided to connect the leads 27 of the power transistor 7 to the other components on the circuit board 9 and/or to the output transformer 12.

Figure 4:
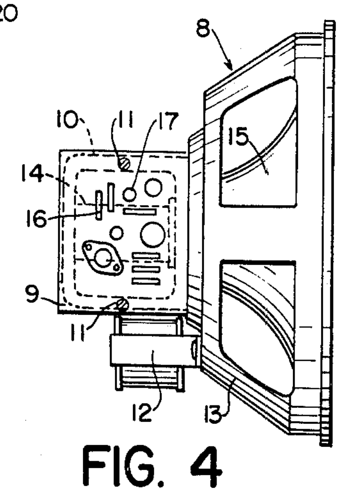
FIG. 4 is a side view of still a third embodiment of the invention.
Figure 5:
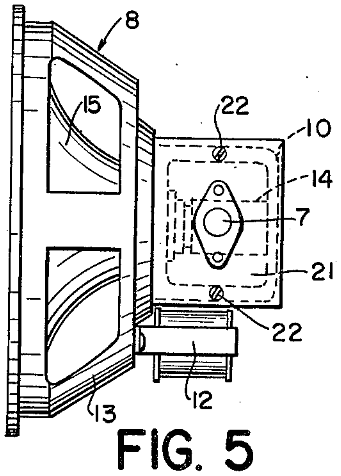
FIG. 5 is a view of the opposite side of the embodiment of FIG. 4.

FIGS. 4 and 5 show still another embodiment of the invention. Here, the printed circuit board 9 is mounted on one of the open sides of the speaker yoke. A metal plate 21 is fastened by means of screws 22 to another open side of the yoke and the power transistor 7 is mounted on this plate remote from circuit board 9. Suitable leads (not shown) connect the power transistor 7 to the other portions of the circuit board 9 and or output transformer 12.

The metal plate 21 serves as a heat sink and, since it in turn is also fastened to the metal yoke, an extremely large heat sink dissipative area is provided. Also the air space in the open yoke behind plate 21 cools it very efficiently.

In all of the embodiments of the invention, more than one transistor can be mounted in heat conductive relationship to the metal parts of the speaker. For example, in the embodiment of FIG. 2 several recesses can be formed in the yoke wall to serve as heat sinks for a like number of transistors mounted on board 9. In the embodiment of FIG. 3, more than one recess can be formed in the frame. Also, in the embodiment of FIGS. 4 and 5 several transistors can be mounted on plate 21. While not shown, one or more recesses also can be formed in a wall of the yoke not carrying the printed circuit board and transistors placed therein to dissipate their heat.

While preferred embodiments of the invention have been described above, it will be understood that these are illustrative only, and the invention is to be limited solely by the appended claim.

What is claimed is:

1. In combination a loud speaker having metal yoke and frame portions, audio frequency amplifying means having at least one heat generating component for amplifying an audio frequency signal applied thereto, the output signal of said amplifier means to be used to operate said speaker, a recess of a shape complementary to said heat generating component formed as an integral section in the metal portion of said yoke, and circuit board means holding said amplifier means, said circuit board means mounted on the yoke portion of said loudspeaker to form a unitary structure with at least a portion of the heat generating component of the amplifier means disposed within said recess and contacting said metal portion of said yoke in a heat transfer relationship, other components of said amplifying means extending beyond the face of the board opposite the yoke for cooling by the environment.

References Cited

UNITED STATES PATENTS

| | | | |
|---|---|---|---|
| 2,954,774 | 5/1961 | Race | 317—234 |
| 3,297,916 | 1/1967 | Wright | 317—234 |
| 2,812,382 | 11/1957 | Michael. | |
| 3,033,537 | 5/1962 | Brown. | |

FOREIGN PATENTS

| | | |
|---|---|---|
| 1,330,026 | 5/1963 | France. |
| 855,966 | 12/1960 | Great Britain. |

KATHLEEN CLAFFY, Primary Examiner

T. W. BROWN, Assistant Examiner

U.S. Cl. X.R.

317—234